United States Patent
Chen (10) Patent No.: US 7,358,802 B2
(45) Date of Patent: Apr. 15, 2008

(54) MULTI-PHASE TECHNIQUES FOR TUNING AND/OR MEASURING OPERATIONS OF AN AMPLIFIER

(75) Inventor: Mingdeng Chen, Harleysville, PA (US)

(73) Assignee: Agere Systems Inc., Allentown, PA (US)

( * ) Notice: Subject to any disclaimer, the term of this patent is extended or adjusted under 35 U.S.C. 154(b) by 205 days.

(21) Appl. No.: 11/295,877

(22) Filed: Dec. 7, 2005

(65) Prior Publication Data

US 2007/0126499 A1 Jun. 7, 2007

(51) Int. Cl.
*H03F 1/02* (2006.01)
(52) U.S. Cl. .................. 330/9; 330/124 R; 330/51
(58) Field of Classification Search .................. 330/9, 330/124 R, 51
See application file for complete search history.

(56) References Cited

U.S. PATENT DOCUMENTS

| | | | | |
|---|---|---|---|---|
| 5,293,169 A * | 3/1994 | Baumgartner et al. | ...... | 341/172 |
| 6,977,542 B2 * | 12/2005 | Ganeshan et al. | .......... | 327/553 |
| 7,119,612 B1 * | 10/2006 | Holloway et al. | ............. | 330/9 |
| 7,126,419 B2 * | 10/2006 | Miyasita | ..................... | 330/69 |
| 7,288,987 B2 * | 10/2007 | Carichner et al. | .......... | 330/136 |

* cited by examiner

*Primary Examiner*—Patricia Nguyen
(74) *Attorney, Agent, or Firm*—Steve Mendelsohn (57) ABSTRACT

Certain embodiments of the present invention relate to techniques for tuning or measuring operational features of amplifiers, such as the transconductance of operational transconductance amplifiers (OTAs) and the gain of variable gain amplifiers (VGAs). Each technique employs (at least) two phases that involve the application of different input voltages. The results of the multiple phases are then combined to generate a final result that negates or reduces the effects of real-world properties such as finite output impedances and offset voltages.

20 Claims, 5 Drawing Sheets

MULTI-PHASE TECHNIQUES FOR TUNING AND/OR MEASURING OPERATIONS OF AN AMPLIFIER

BACKGROUND OF THE INVENTION

1. Field of the Invention

The present invention relates to electronics, and, in particular, to techniques for tuning and/or measuring operations of an amplifier, such as an operational transconductance amplifier or a variable gain amplifier.

2. Description of the Related Art

Figure 1:
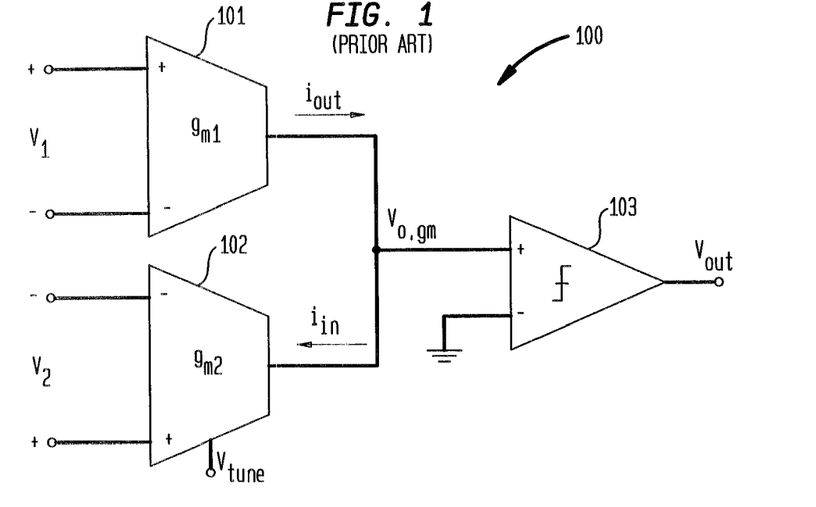
FIG. 1 illustrates a block diagram of a circuit for tuning an operational transconductance amplifier (OTA).

FIG. 1 illustrates a block diagram of a conventional circuit 100 for tuning an operational transconductance amplifier (OTA) 102. In addition to OTA cell 102, tuning circuit 100 includes reference OTA cell 101 and comparator 103. The output nodes of OTA cells 101 and 102 are connected together and to the positive input node of comparator 103, which shared node is at voltage $V_{o,gm}$.

$V_{tune}$ is a tuning voltage that is used to adjust the transconductance ($g_{m2}$) of OTA cell 102. Input voltages $V_1$ and $V_2$ are applied across the input nodes of OTA cells 101 and 102, respectively, where voltages $V_1$ and $V_2$ have identical magnitude, but opposite polarities as indicated in FIG. 1. With voltages $V_1$ and $V_2$ applied with the polarities indicated in FIG. 1, reference OTA cell 101 sources current $i_{out}$, and OTA cell 102 sinks current $i_{in}$. If $i_{out}$ equals $i_{in}$, then the shared node voltage $V_{o,gm}$ is zero, since voltage $V_{o,gm}$ corresponds to the current flowing into the positive input node of comparator 103 times the impedance of that input node. If $i_{out} \neq i_{in}$, then the excess current is either sourced or sunk by the positive input node of comparator 103, which causes $V_{o,gm}$ to be either greater than or less than zero. Because the negative input node of comparator 103 is connected to ground, the output voltage $V_{out}$ of comparator 103 toggles between a logical 0 and a logical 1 when the value of the difference in current, $i_{out} - i_{in}$, changes polarity, thus causing the shared node voltage $V_{o,gm}$ to change its polarity.

A balanced condition occurs when $i_{out} = i_{in}$ and $V_{o,gm} = 0$. Stated differently, the balanced condition occurs when $g_{m1} V_1 = g_{m2} V_2$ (i.e., $g_{m2} = g_{m1}(V_1/V_2)$). As such, OTA cell 102 may be successfully tuned by adjusting voltage $V_{tune}$ to determine when such a balanced condition between currents $i_{in}$ and $i_{out}$ exists by monitoring the output of comparator 103.

Figure 2:
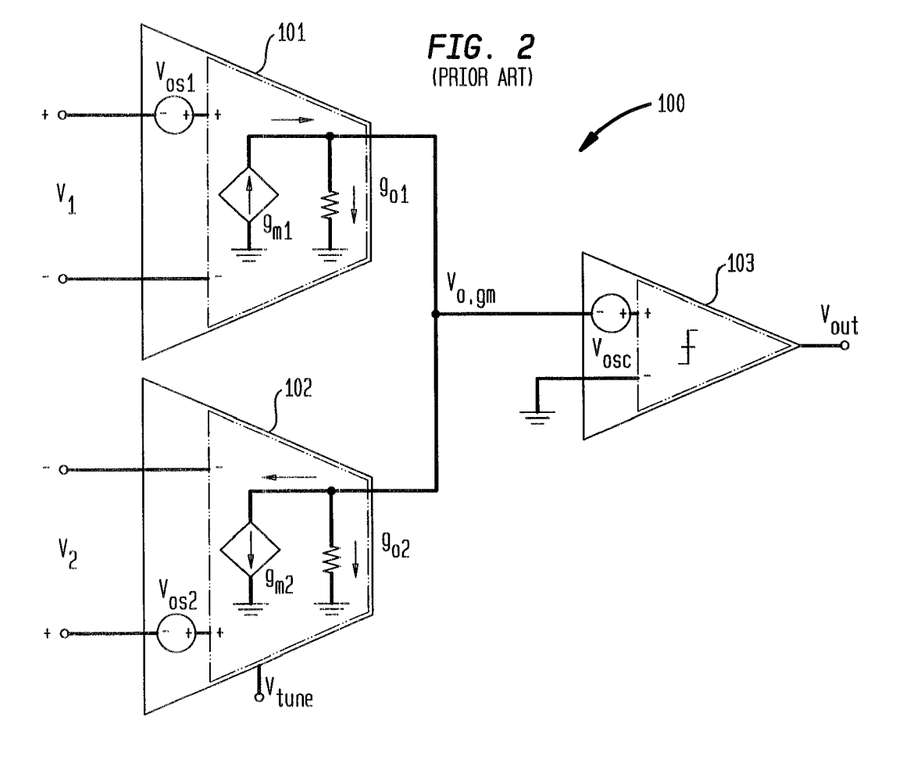
FIG. 2 illustrates a more-detained block diagram of the tuning circuit of FIG. 1.

FIG. 2 illustrates a more-detailed block diagram of the tuning circuit of FIG. 1. As indicated in FIG. 2, real-world (i.e., actual, physical) implementations of OTA cells 101-102 and comparator 103 include non-idealized electrical properties such as finite output impedances and offsets voltages. In particular, in addition to reference transconductance $g_{m1}$, reference OTA cell 101 has an offset voltage measured at its input nodes (represented by $V_{os1}$ in FIG. 2) and a finite output impedance (represented by $g_{o1}$ in FIG. 2). Similarly, in addition to transconductance $g_{m2}$ to be tuned, OTA cell 102 has an offset voltage (represented by $V_{os2}$ in FIG. 2) and a finite output impedance (represented by $g_{o2}$ in FIG. 2). Comparator 103 also has an offset voltage (represented by $V_{osc}$ in FIG. 2). By taking all of these non-ideal circuit properties into account, a more-accurate model for the operation of tuning circuit 100 may be developed and transconductance $g_{m2}$ may be tuned more accurately.

By using node analysis on node $V_{o,gm}$, the balanced condition is defined by Equation (1):

$$g_{m1} \cdot (V_1 + V_{os1}) = (-V_{osc}) \cdot (g_{o1} + g_{o2}) + g_{m2} \cdot (V_2 + V_{os2}) \quad (1)$$

Equation (1) may be rewritten in terms of $g_{m2}$ as Equation (2):

$$g_{m2} = g_{m1} \cdot \left(\frac{V_1 + V_{os1}}{V_2 + V_{os2}}\right) + \left(\frac{V_{osc}}{V_2 + V_{os2}}\right) \cdot (g_{o1} + g_{o2}) \quad (2)$$

From Equation (2), transconductance $g_{m2}$ may be different from transconductance $g_{m1}$ even with the magnitude of voltage $V_1$ equal to the magnitude of voltage $V_2$. The finite output impedances ($g_{o1}$ and $g_{o2}$) and offset voltages ($V_{os1}$ and $V_{os2}$) of OTA cells 101 and 102, and the offset voltage ($V_{osc}$) of comparator 203 limit the ability to accurately match transconductance $g_{m1}$ and transconductance $g_{m2}$. The relative error between transconductance $g_{m2}$ and reference transconductance $g_{m1}$ depends on these values as well as on voltages $V_1$ and $V_2$.

Finite output impedance $g_{o1}$ may be made fairly small, since reference OTA cell 101 does not need to process data while in use and, as a result, may be operated slowly. But finite output impedance $g_{o2}$ may correspond to a relatively large fraction of $g_{m2}$. This condition is especially likely with advanced technologies and high-speed applications. Even without offset voltages $V_{os1}$ and $V_{os2}$, an error of a few percent may be observed because of the finite output impedances of OTA cells 101-102 and the offset voltage $V_{osc}$ of comparator 203. This amount of error might not be acceptable for some applications.

SUMMARY OF THE INVENTION

In one embodiment, the present invention is a method for operating an amplifier having at least one operating parameter, the method comprising first and second phases. During the first phase, (1) a first-phase input voltage is applied to the amplifier to generate a first-phase amplifier output signal and (2) the first-phase amplifier output signal and a first-phase reference signal are applied to a comparator to generate a first-phase comparison result. The first-phase comparison result depends on the at least one operating parameter. During the second phase, (1) a second-phase input voltage is applied to the amplifier to generate a second-phase amplifier output signal, wherein the second-phase input voltage is different from the first-phase input voltage and (2) the second-phase amplifier output signal and a second-phase reference signal are applied to the comparator to generate a second-phase comparison result. The second-phase comparison result depends on the at least one operating parameter. The first-phase and second-phase comparison results are combined to generate a final result such that dependence of the final result on the at least one amplifier operating parameter is negated or reduced.

In another embodiment, the present invention is circuitry comprising an amplifier, a comparator, and a control module. The amplifier has at least one operating parameter. The comparator is (1) connected to receive and compare an output signal from the amplifier and a reference signal and (2) generates a comparison result based on the comparison of the amplifier output signal and the reference signal. The control module controls selection of input voltages applied to the amplifier and processes comparison results from the comparator during first and second phases of operation of the circuitry. During the first phase, (1) a first-phase input voltage is applied to the amplifier to generate a first-phase amplifier output signal and (2) the first-phase amplifier output signal and a first-phase reference signal are applied to the comparator to generate a first-phase comparison result. The first-phase comparison result depends on the at least one operating parameter. During the second phase, (1) a second-phase input voltage is applied to the amplifier to generate a second-phase amplifier output signal, wherein the second-phase input voltage is different from the first-phase input voltage and (2) the second-phase amplifier output signal and a second-phase reference signal are applied to the comparator to generate a second-phase comparison result. The second-phase comparison result depends on the at least one operating parameter. The first-phase and second-phase comparison results are combined to generate a final result such that dependence of the final result on the at least one amplifier operating parameter is negated or reduced.

In yet another embodiment, the invention is circuitry comprising a variable-gain amplifier, a first switch module, a comparator, a second switch module, and a control module. The variable-gain amplifier comprises at least one operating parameter, a first amplifier input node, a second amplifier input node, and a gain control input node. The amplifier is adapted to (1) generate a first-phase amplifier output signal during a first phase and (2) generate a second-phase amplifier output signal during a first phase. The first switch module comprises a first S1 switch and a first S2 switch. The first S1 switch comprises a S1 first input node coupled to the first-phase input voltage and a second S1 input node coupled to the first amplifier input node of the amplifier. The first S2 switch comprises a S2 first input node coupled to the second-phase input voltage and a S2 second input node coupled to the first amplifier input node and to the second S1 input node of the first S1 switch. The comparator comprises a first comparator input node and a second comparator input node, and is adapted to (1) generate a first-phase comparison result during the first phase, wherein the first-phase comparison result depends on the at least one operating parameter and (2) generate a second-phase comparison result during the second phase, wherein the second-phase comparison result depends on the at least one operating parameter. The second switch module comprises a second S1 switch and a second S2 switch. The second S1 switch comprises a first S1a input node coupled to the first-phase reference signal and a second S1a input node coupled to the first comparator input node. The second S2 switch comprises a first S2a input node coupled to the second-phase reference signal and a second S2a input node coupled to the first comparator input node and to the second S1a input of second S1 switch. The control module has a gain control output node coupled to the gain control input node of the variable-gain amplifier, and is adapted to (1) adjust the gain of the variable gain amplifier during the first phase to generate the first-phase comparison result, (2) adjust the gain of the variable gain amplifier during the second phase to generate the second-phase comparison result, and (3) combine the first-phase and second-phase comparison results to generate a final result such that dependence of the final result on the at least one amplifier operating parameter is negated or reduced. The first S1 switch and the second S1 switch are closed during the first phase. The first S2 switch and the second S2 switch are closed during the second phase.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 3:
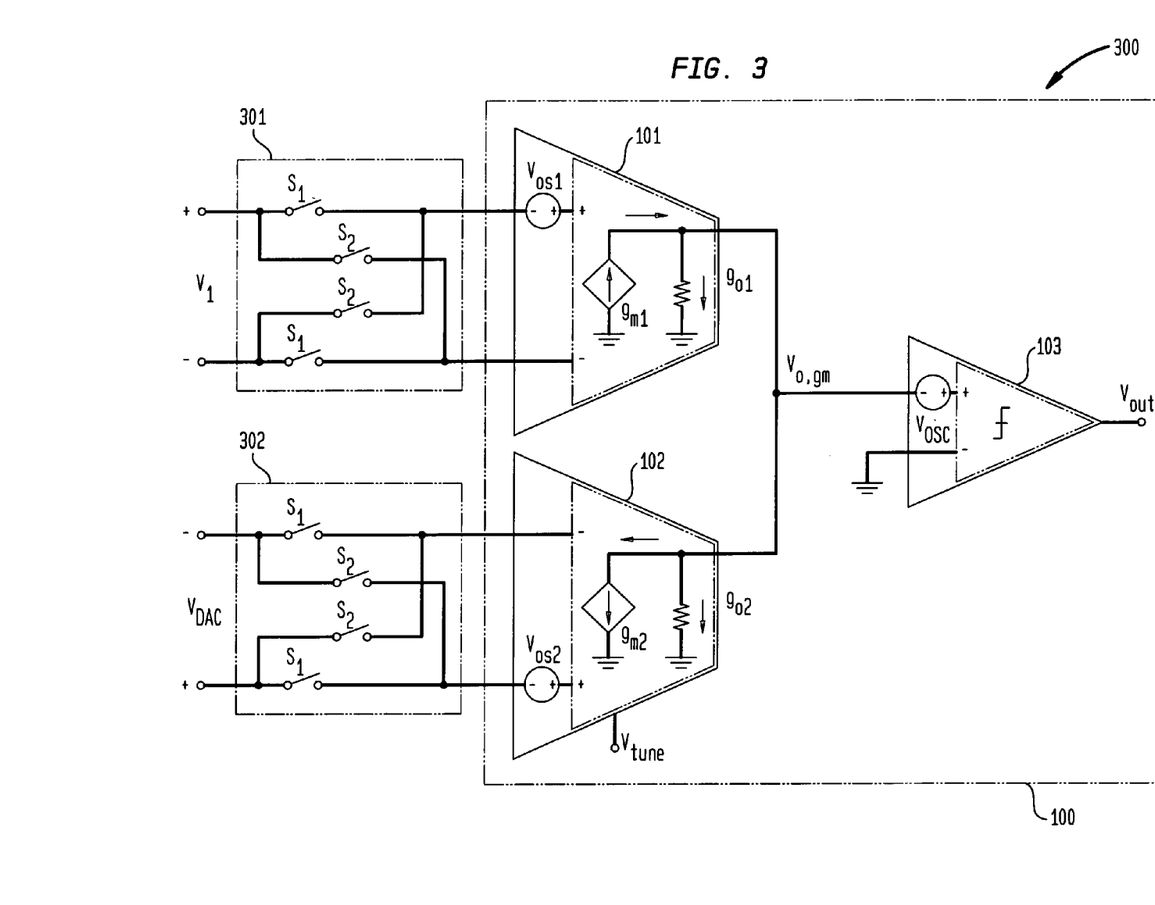
FIG. 3 illustrates a block diagram of a circuit for tuning an OTA, according to one possible embodiment of the present invention.

FIG. 3 illustrates a block diagram of circuit 300 for tuning operational transconductance amplifier 102, according to one possible embodiment of the present invention. In addition to tuning circuit 100 of FIGS. 1 and 2, tuning circuit 300 comprises a first switch module 301 connected between voltage $V_1$ and the input nodes of reference OTA cell 101 and a second switch module 302 connected between a voltage $V_{DAC}$ and the input nodes of "to-be-tuned" OTA cell 102. Each switch module includes two pairs of switches $S_1$ and $S_2$. During two non-overlapping phases of the operation of tuning circuit 300, the input voltages, $V_1$ and $V_{DAC}$, are applied to the input nodes of OTA cells 101-102, respectively, but with different polarity configurations. Voltages $V_1$ and $V_{DAC}$ are voltages having identical magnitudes but opposite polarities. Using node analysis similar to the analysis discussed above with reference to FIGS. 1-2, a set of equations may be developed.

During phase one, switches $S_1$ are closed and switches $S_2$ are open in both switch modules 301 and 302, in order to apply voltage $V_1$ and voltage $V_{DAC}$ with a first polarity configuration to the input nodes of OTA cell 101 and OTA cell 102, respectively. $V_{tune}$ is adjusted until a balanced condition exists, for which Equation (3) applies:

$$g_{m1} \cdot (V_1 + V_{os1}) = (-V_{osc}) \cdot (g_{o1} + g_{o2}) + g_{m2} \cdot (V_2 + V_{os2}) \qquad (3)$$

The particular value of tuning voltage $V_{tune}$ corresponding to the phase-one balanced condition of Equation (3) may be denoted as a control voltage $V_{tune}^1$.

Similarly, during phase two, switches $S_1$ are open and switches $S_2$ are closed in both switch modules 301 and 302, in order to apply voltage $V_1$ and voltage $V_{DAC}$ with a second polarity configuration to the input nodes of OTA cell 101 and OTA cell 102, respectively. $V_{tune}$ is again adjusted until a balanced condition exists, for which Equation (4) applies:

$$g'_{m2} \cdot (V_2 - V'_{os2}) = (-V_{osc}) \cdot (g_{o1} + g'_{o2}) + g_{m1} \cdot (V_1 - V_{os1}) \qquad (4)$$

where $g'_{m2}$, $V'_{os2}$, and $g'_{o2}$ correspond to the transconductance, offset voltage, and finite output impedance of OTA cell 102 during phase two. The particular value of tuning voltage $V_{tune}$ corresponding to the phase-two balanced condition of Equation (4) may be denoted as a control voltage $V_{tune}^2$.

Adding Equations (3) and (4) yields Equation (5) as follows:

$$(g_{m2}+g'_{m2}) \cdot V_2 = 2g_{m1}V_1 - (g_{m2}V_{os2} - g'_{m2}V'_{os2}) + (g_{os2} + g'_{os2}) \cdot V_{osc} \quad (5)$$

Note that the output impedance of OTA cell 101, the offset voltage of OTA cell 101, and the offset voltage of comparator 103 do not appear in Equation (5). Because $g_{m2}$ is close to $g'_{m2}$ in Equation (5) where the difference between $g_{m2}$ and $g'_{m2}$ is caused by the non-ideal circuit properties, and because $V_{os2}$ is close to $V'_{os2}$, the term $g_{m2}V_{os2} - g'_{m2}V'_{os2}$ is small compared to $2 g_{m1}V_1$. Similarly, $g_{o2}$ is close to $g_{o1}$, and $(g_{o2}-g'_{o2})$ is small compared to $2g_{m1}V_1$. As such, Equation (5) may be simplified as follows:

$$(g_{m2}+g'_{m2}) \cdot V_2 = 2g_{m1}V_1 \quad (6)$$

By choosing $$V_{tune} = \left( \frac{V_{tune}^1 + V_{tune}^2}{2} \right),$$

tuning circuit 300 may more accurately match the transconductance of OTA cell 102 to the transconductance of reference OTA cell 101. As long as transconductance $g_{m2}$ is proportional to $V_{tune}$ monotonically, transconductance $g_{m2}$ may be accurately matched to transconductance $g_{m1}$. If $V_{tune}$ is digitally controlled by a digital-to-analog converter (DAC), then a result may be determined using the average of the two DAC values corresponding to $V_{tune}^1$ and $V_{tune}^2$.

Figure 4:
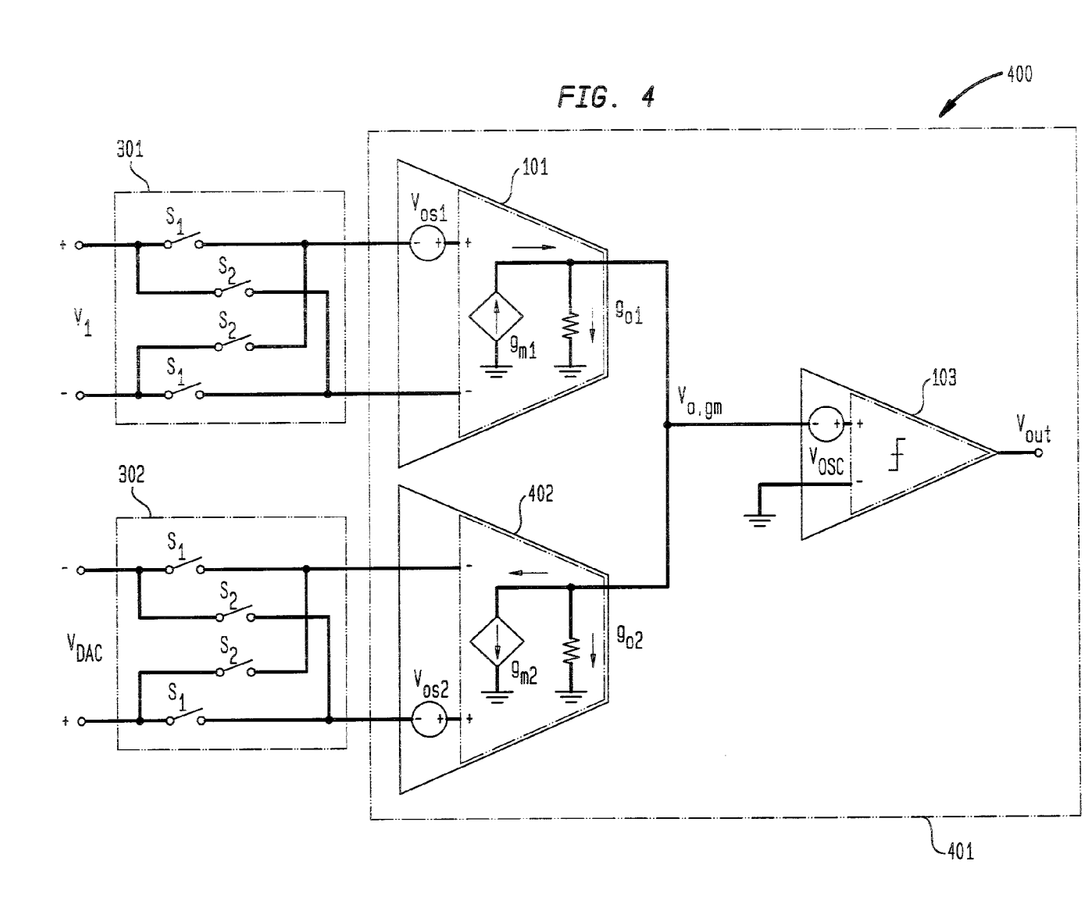
FIG. 4 illustrates a block diagram of a circuit for measuring the transconductance of an OTA, according to one possible embodiment of the present invention.

FIG. 4 illustrates a block diagram of a circuit 400 for measuring the transconductance of an operational transconductance amplifier 402, according to one possible embodiment of the present invention. Measurement circuit 400 is identical to tuning circuit 300 of FIG. 3, except that to-be-tuned OTA cell 402 does not utilize a tuning voltage $V_{tune}$.

The two-phase procedure discussed with regard to tuning circuit 300 may be used with circuit 400 to determine the transconductance of OTA cell 402. Instead of applying a fixed input voltage $V_{DAC}$ having the same magnitude as $V_1$, input voltage $V_{DAC}$ is adjusted until a balanced condition is achieved (i.e., where the output voltage of comparator 103 just begins to toggle between logical 0 and logical 1) during each of the two phases of operation. Switches $S_1$ are closed during phase one to determine input voltage $V_{DAC}^1$ at which the phase-one balanced condition exists. During phase two, switches $S_2$ are closed and input voltage $V_{DAC}^2$ is determined at which the phase-two balanced condition exists.

The following equations apply to phase one and phase two for circuit 400:

$$g_{m1} \cdot (V_1+V_{os1}) = (-V_{osc}) \cdot (g_{os1}+g_{os2}) + g_{m2} \cdot (V_{DAC}^1 + V_{os2}) \quad (7)$$

$$g_{m2} \cdot (V_{DAC}^2 - V_{os2}) = (-V_{osc}) \cdot (g_{os1}+g_{os2}) + g_{m1} \cdot (V_1 - V_{os1}) \quad (8)$$

Adding Equations (7) and (8) yields Equation (9) as follows:

$$g_{m2} = g_{m1} \cdot \left( \frac{2V_1}{V_{DAC}^1 + V_{DAC}^2} \right) \quad (9)$$

All of the non-idealized circuit parameters disappear and a precise measurement for the transconductance of OTA cell 402 is obtained using Equation (9).

Figure 5:
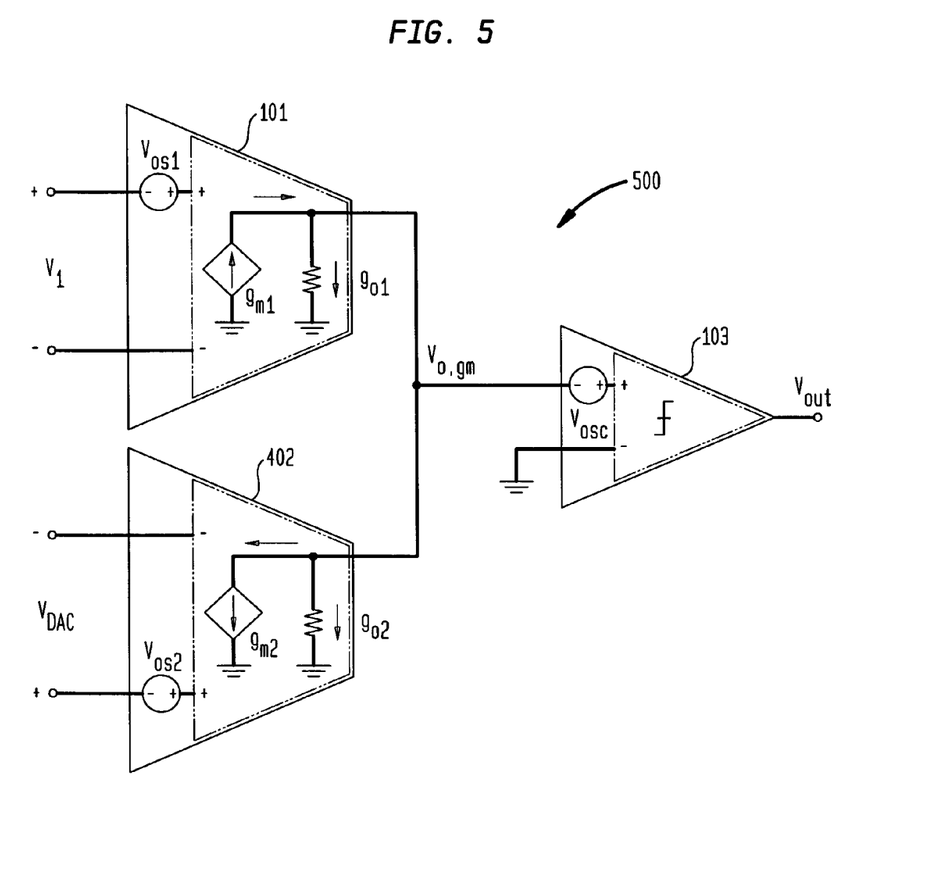
FIG. 5 illustrates a block diagram of a circuit for measuring the transconductance of an OTA, according to another possible embodiment of the present invention.

FIG. 5 illustrates a block diagram of a circuit 500 for measuring the transconductance of operational transconductance amplifier 402, according to another possible embodiment of the present invention. Measuring circuit 500 is identical to measuring circuit 400 of FIG. 4, except that switch modules 301 and 302 are omitted. Instead of switching the polarities of input voltages $V_1$ and $V_{DAC}$ during the two phases of operation of measurement circuit 500, the magnitude of input voltage $V_1$ applied to reference OTA cell 101 is doubled for phase two. That is, input voltage $V_1$ is applied to OTA cell 101 during phase one, and input voltage $2V_1$ is applied to OTA cell 101 during phase two. As in the measurement procedure of circuit 400, during each of the two phases for circuit 500, voltage $V_{DAC}$ is adjusted to achieve a balanced condition.

The following equations apply to phase one and phase two for circuit 500:

$$g_{m2} \cdot (V_{DAC}^1 + V_{os2}) = (-V_{osc}) \cdot (g_{o1}+g_{o2}) + g_{m1} \cdot (V_1 - V_{os1}) \quad (10)$$

$$g_{m2} \cdot (V_{DAC}^2 + V_{os2}) = (-V_{osc}) \cdot (g_{o1}+g_{o2}) + g_{m1} \cdot (2V_1 - V_{os1}) \quad (11)$$

Subtracting Equation (10) from Equation (11) yields Equation (12) as follows:

$$g_{m2} = g_{m1} \cdot \left( \frac{V_1}{V_{DAC}^2 - V_{DAC}^1} \right) \quad (12)$$

Therefore, by measuring the voltage $V_{DAC}$ during each of the two phases that generates a balanced condition and using the known transconductance $g_{m1}$ from reference OTA cell 101, a precise measurement of the transconductance $g_{m2}$ of OTA cell 402 may be determined using Equation (12).

The above examples illustrate techniques for tuning an OTA or measuring the transconductance of an OTA. The present invention may also be applied to other types of amplifiers such as variable gain amplifiers.

Figure 6:
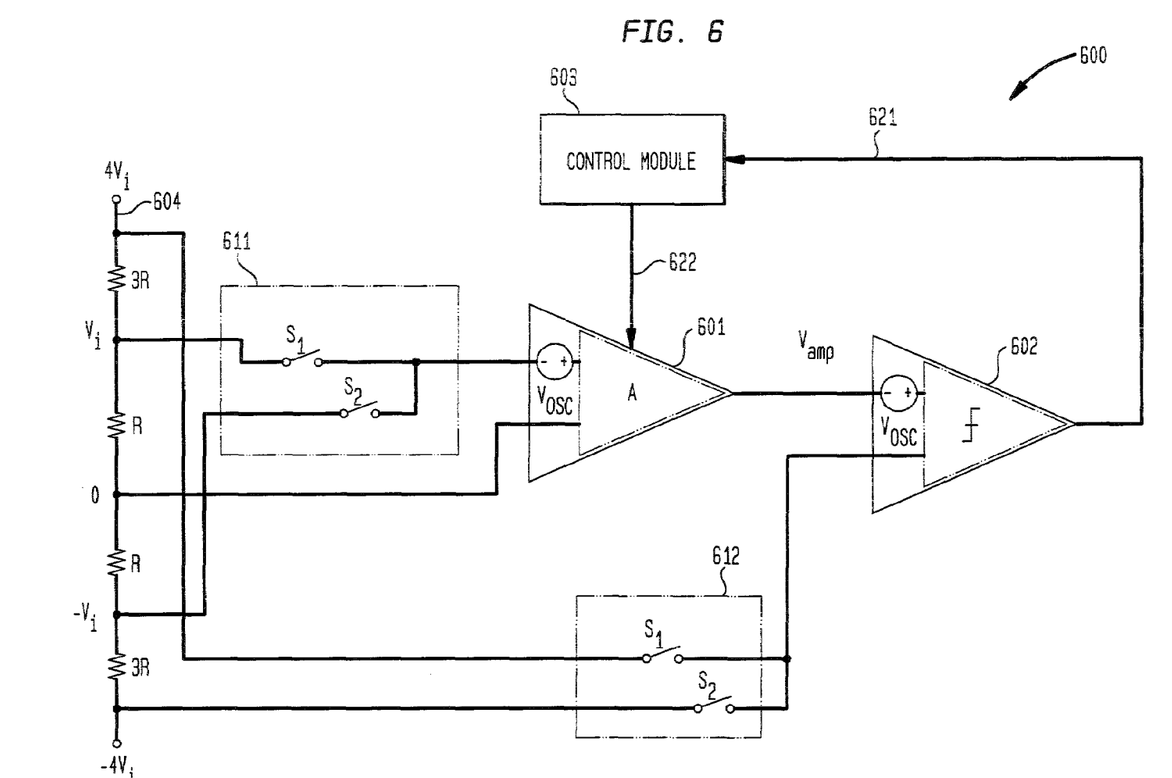
FIG. 6 illustrates a block diagram of a circuit for tuning the gain of a variable gain amplifier, according to an embodiment of the present invention.

FIG. 6 illustrates a block diagram of a circuit 600 for tuning the gain A of a variable gain amplifier (VGA) 601, according to one embodiment of the present invention. In addition to VGA 601, circuit 600 comprises comparator 602, control module 603, voltage-dividing resistor network 604, first switch module 611, and second switch module 612. In this exemplary implementation, circuit 600 tunes the VGA gain to have a value A of 4.

Resistor network 604 divides an 8Vi differential voltage range, such that voltages $+V_i$ and 0 are applied to the two inputs of first switch module 611, and voltages $+4V_i$ and $-4V_i$ are applied to the two inputs of second switch module 612. The number and value of the resistors within voltage divider resistor network 604 are selected to provide voltages having a desired magnitude ratio of 4:1. One skilled in the art will recognize that other circuitry may be implemented to provide input voltages with that same 4:1 magnitude ratio (or a different magnitude ratio) without departing from the spirit and scope of the present invention.

The output from first switch module 611 is applied to a first input of VGA 601. A zero-volt voltage is applied to a second input of VGA 601. The output of VGA 601 is connected to one of the two inputs of comparator 602, and the single output of switch module 612 is connected to the other input of comparator 602. The output (621) of comparator 602 is applied to control module 603, which generates control signal 622 for controlling the gain A of VGA 601.

During phase one of a two-phase tuning operation for circuit 600, switches $S_1$ are closed and switches $S_2$ are open in both switch modules, such that input voltages $+V_i$ and 0 are applied to the inputs of VGA 601, and $+4V_i$ is applied to the second input of comparator 602. During phase two, switches $S_1$ are open and switches $S_2$ are closed, such that input voltages $-V_i$ and 0 are applied to the inputs of VGA 601, and $-4V_i$ is applied to the second input of comparator 602.

During phase one, VGA 601 generates an output voltage $V_{amp}$ that corresponds to $AV_i$, and comparator 602 generates digital signal 621 having a logical value of 1 when $V_{amp} > 4V_i$ and a logical value of 0 when $V_{amp} < 4V_i$. Digital signal 621 is transmitted to control module 603 for use in adjusting the gain value A within VGA 601. If digital signal 621 is a logical 1, then control module 603 lowers gain value A within VGA 601 using gain control signal 622. If digital signal 621 is a logical 0, then control module 603 raises gain value A within VGA 601 using gain control signal 622. When digital signal 621 just toggles between a logical 1 and a logical 0, comparator 602 indicates that $V_{amp} = 4V_i$. As such, control module 603 adjusts the gain value A within VGA 601 until digital signal 621 just toggles between a logical 0 and a logical 1.

Control module 603 may adjust the gain value A to tune VGA 601 using any number of search procedures. In one embodiment, control module 603 may adjust the gain value A by sequentially increasing or decreasing the value of gain control signal 622 by a single step within a plurality of equally-spaced values across a range of possible values until digital signal 621 changes state. In another embodiment, control module 603 may increase or decrease the value of gain control signal 622 within the range of possible values using a binary search algorithm to determine more quickly the value for gain control signal 622 corresponding to the desired gain value of 4. One skilled in the art will recognize that different possible search procedures affect both the complexity of control module 603 and the number of adjustments required for control module 603 to successfully tune the gain value A. More complex search procedures will typically generate a faster search.

Control module 603 may be implemented using a programmable processor that executes instructions to implement the variable gain search procedure that adjusts the gain value A by altering gain control signal 622. Control module 603 may also be implemented using a state machine and/or digital logic functions to implement the variable gain search procedure that adjusts the gain value A.

In one possible implementation of circuit 600, gain control signal 622 corresponds to a bias current within variable gain amplifier 601. When the bias current is modified, the gain value A changes. One skilled in that art recognizes that other input control signals may be used that provide a relationship between the particular control signal and the gain value A without departing from the spirit and scope of the present invention.

As is the case with respect to the OTAs and comparators in FIGS. 1-5, and as indicated in FIG. 6, real-world implementations of VGA 601 and comparator 602 have offset voltages $V_{osa}$ and $V_{osc}$, respectively, that may need to be considered when tuning a variable gain amplifier. Using the two-phase procedure discussed previously, during phase two, the input voltages to VGA 601 are swapped and an input voltage of $-4V_i$ is applied to comparator 602. In this case, $V_{amp} = -AV_{in}$, and digital signal 621 is a logical 1 when $V_{amp} > -4V_i$ and a logical value of 0 when $V_{amp} < -4V_i$. An analogous search procedure is implemented to adjust the gain value A until the state of digital signal 621 just toggles.

The following equations apply to phase one and phase two for circuit 600:

$$A_1 \cdot (V_i + V_{osa}) = 4V_i - V_{osc} \tag{13}$$

$$A_2 \cdot (-V_i + V_{osa}) = -4V_i - V_{osc} \tag{14}$$

where $A_1$ is the phase-one tuned VGA gain and $A_2$ is the phase-two tuned VGA gain.

Subtracting Equation (14) from Equation (13) yields Equation (15) as follows:

$$(A_1 + A_2) \cdot V_i + (A_1 - A_2) \cdot V_{osa} = 8V_i \tag{15}$$

Because the term $(A_1 - A_2)V_{osa}$ in Equation (15) is very small (because $A_1$ and $A_2$ are nearly identical), Equation (15) may be simplified as follows:

$$(A_1 + A_2) \cdot V_i = 8V_i \tag{16}$$

$$(A_1 + A_2) = 8 \tag{17}$$

$$\frac{(A_1 + A_2)}{2} = 4 \tag{18}$$

Therefore, by setting the gain of VGA 601 to the average of $A_1$ and $A_2$, VGA 601 will operate with an effective gain that is close to the desired gain value of 4 over the entire range of voltages from $+4V_i$ to $-4V_i$ and possibly over an even wider voltage range.

In the example of circuit 600, a desired gain value of 4 was used. Different desired gain values may be obtained by using the voltage ratio of $NV_i/V_i$ where N corresponds to the desired gain value. A different voltage-divider resistor network 603 would be needed to generate the proper ratio of $NV_i$ to $V_i$ for values of N other than 4. Because the $V_i$ term drops from Equation (16) when it is simplified further in Equation (17), the voltage value $V_i$ and $NV_i$ may correspond to any voltage value having a ratio of N without departing from the spirit and scope of the present invention.

Although the present invention has been described in the context of two-phase procedures for tuning or measuring the operations of amplifiers, where the results of the two phases are combined to generate a final result, in which the effects of certain real-world properties such as finite output impedances or offset voltages are either negated or negligible, the invention can also be implemented using multi-phase procedures having more than two phases in which the results of the different phases are combined to generate a final result that negates or reduces the effects of such real-world properties. Such procedures may be designed to negate or reduce the effects of real-world properties other than output impedances and offset voltages, such as mismatch, non-linearity, systematic errors, etc.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing steps in a software program. Such software may be employed in, for example, a digital signal processor, a micro-controller, or a general-purpose computer.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

I claim:

1. A method for operating an amplifier having at least one operating parameter, the method comprising:
   a first phase, during which:
      a first-phase input voltage is applied to the amplifier to generate a first-phase amplifier output signal; and
      the first-phase amplifier output signal and a first-phase reference signal are applied to a comparator to generate a first-phase comparison result, wherein the first-phase comparison result depends on the at least one operating parameter; and
   a second phase, during which:
      a second-phase input voltage is applied to the amplifier to generate a second-phase amplifier output signal, wherein the second-phase input voltage is different from the first-phase input voltage; and
      the second-phase amplifier output signal and a second-phase reference signal are applied to the comparator to generate a second-phase comparison result, wherein the second-phase comparison result depends on the at least one operating parameter, wherein:
         the first-phase and second-phase comparison results are combined to generate a final result such that dependence of the final result on the at least one amplifier operating parameter is negated or reduced.

2. The invention of claim 1, wherein:
   the amplifier is a first operational transconductance amplifier (OTA) having an offset voltage and a finite output impedance as its at least one operating parameter;
   during the first phase:
      a first-phase first-OTA input voltage is applied to the first OTA to generate a first-phase first-OTA output signal;
      a first-phase reference-OTA input voltage is applied to a reference OTA to generate a first-phase reference-OTA output signal;
      the first-phase first-OTA output signal and the first-phase reference-OTA output signal are combined and applied to a first input of the comparator; and
      the first-phase reference signal is applied to a second input of the comparator; and during the second phase:
      a second-phase first-OTA input voltage is applied to the first OTA to generate a second-phase first-OTA output signal;
      a second-phase reference-OTA input voltage is applied to the reference OTA to generate a second-phase reference-OTA output signal;
      the second-phase first-OTA output signal and the second-phase reference-OTA output signal are combined and applied to the first input of the comparator; and
      the second-phase reference signal is applied to the second input of the comparator.

3. The invention of claim 2, wherein:
   the first-phase first-OTA input voltage and the first-phase reference-OTA input voltage have substantially identical magnitudes and opposite polarities;
   the first-phase first-OTA input voltage and the second-phase first-OTA input voltage have substantially identical magnitudes and opposite polarities;
   the first-phase reference-OTA input voltage and the second-phase reference-OTA input voltage have substantially identical magnitudes and opposite polarities;
   during the first phase, transconductance of the first OTA is adjusted until an output signal from the comparator indicates that a first-phase balanced condition exists;
   during the second phase, the transconductance of the first OTA is adjusted until the output signal from the comparator indicates that a second-phase balanced condition exists; and
   the first OTA is tuned by setting the transconductance of the first OTA to a value based on the first-phase balanced-condition transconductance of the first OTA and the second-phase balanced-condition transconductance of the OTA.

4. The invention of claim 3, wherein:
   the transconductance of the first OTA is adjusted by adjusting a tuning voltage for the first OTA; and
   the first OTA is tuned by setting the tuning voltage for the first OTA equal to an average of the first-phase balanced-condition tuning voltage for the first OTA and the second-phase balanced-condition tuning voltage for the first OTA.

5. The invention of claim 2, wherein:
   the first-phase reference-OTA input voltage and the second-phase reference-OTA input voltage have substantially identical magnitudes and opposite polarities;
   during the first phase, the first-phase first-OTA input voltage is adjusted until an output signal from the comparator indicates that a first-phase balanced condition exists;
   during the second phase, the second-phase first-OTA input voltage is adjusted until the output signal from the comparator indicates that a second-phase balanced condition exists; and
   transconductance of the first OTA is determined based on the first-phase balanced-condition first-OTA input voltage and the second-phase balanced-condition first-OTA input voltage.

6. The invention of claim 5, wherein the transconductance $g_{m2}$ of the first OTA is determined according to:

$$g_{m2} = g_{m1} \cdot \left( \frac{2V_1}{V_{DAC}^1 + V_{DAC}^2} \right)$$

wherein:
$g_{m1}$ is transconductance of the reference OTA;
$V_1$ is magnitude of the first-phase reference-OTA input voltage;
$V_{DAC}^1$ is the first-phase balanced-condition first-OTA input voltage; and
$V_{DAC}^2$ is the second-phase balanced-condition first-OTA input voltage.

7. The invention of claim 2, wherein:
the second-phase reference-OTA input voltage is substantially twice as large as the first-phase reference-OTA input voltage;
during the first phase, the first-phase first-OTA input voltage is adjusted until an output signal from the comparator indicates that a first-phase balanced condition exists;
during the second phase, the second-phase first-OTA input voltage is adjusted until the output signal from the comparator indicates that a second-phase balanced condition exists; and
transconductance of the first OTA is determined based on the first-phase balanced-condition first-OTA input voltage and the second-phase balanced-condition first-OTA input voltage.

8. The invention of claim 7, wherein the transconductance $g_{m2}$ of the first OTA is determined according to:

$$g_{m2} = g_{m1} \cdot \left( \frac{V_1}{V_{DAC}^2 - V_{DAC}^1} \right)$$

wherein:
$g_{m1}$ is transconductance of the reference OTA;
$V_1$ is magnitude of the first-phase reference-OTA input voltage;
$V_{DAC}^1$ is the first-phase balanced-condition first-OTA input voltage; and
$V_{DAC}^2$ is the second-phase balanced-condition first-OTA input voltage.

9. The invention of claim 1, wherein:
the amplifier is a variable gain amplifier (VGA) having an offset voltage as its at least one operating parameter;
during the first phase:
a first-phase VGA input voltage is applied to the VGA to generate a first-phase VGA output signal;
the first-phase VGA output signal and a first-phase reference signal are applied to the comparator; and
the gain of the VGA is adjusted until an output signal from the comparator indicates that a first-phase balanced condition exists;
during the second phase:
a second-phase VGA input voltage is applied to the VGA to generate a second-phase VGA output signal;
the second-phase VGA output signal and a second-phase reference signal are applied to the comparator; and
the gain of the VGA is adjusted until the output signal from the comparator indicates that a second-phase balanced condition exists; and
the VGA is tuned by setting the gain of the VGA to a value based on the first-phase balanced-condition gain of the VGA and the second-phase balanced-condition gain of the VGA.

10. Circuitry comprising:
a variable-gain amplifier having at least one operating parameter, a first amplifier input node, a second amplifier input node, and a gain control input node, and adapted to (1) generate a first-phase amplifier output signal during a first phase and (2) generate a second-phase amplifier output signal during a second phase;
a first switch module connected to apply (1) a first-phase input voltage to the variable-gain amplifier input nodes during the first phase and (2) a second-phase input voltage to the variable-gain amplifier input nodes during the second phase;
a reference amplifier having input nodes and adapted to (1) generate a first-phase reference output signal during the first phase and (2) generate a second-phase reference output signal during the second phase;
a comparator having a first comparator input node connected to receive a combination of the amplifier and reference output signals, and a second comparator input node, and adapted to (1) generate a first-phase comparison result during the first phase, wherein the first-phase comparison result depends on the at least one operating parameter and (2) generate a second-phase comparison result during the second phase, wherein the second-phase comparison result depends on the at least one operating parameter;
a second switch module connected to apply (1) a first-phase reference voltage to the reference amplifier input nodes during the first phase and (2) a second-phase reference voltage to the reference amplifier input nodes during the second phase; and
a control module having a gain control output node coupled to the gain control input node of the variable-gain amplifier, and adapted to (1) adjust the gain of the variable gain amplifier during the first phase to generate the first-phase comparison result, (2) adjust the gain of the variable gain amplifier during the second phase to generate the second-phase comparison result, and (3) combine the first-phase and second-phase comparison results to generate a final result such that dependence of the final result on the at least one amplifier operating parameter is negated or reduced.

11. Apparatus for operating an amplifier having at least one operating parameter, the apparatus comprising:
means for (1) applying a first-phase input voltage to the amplifier during a first phase to generate a first-phase amplifier output signal and (2) applying a second-phase input voltage to the amplifier during a second phase to generate a second-phase amplifier output signal, wherein the second-phase input voltage is different from the first-phase input voltage;
a comparator adapted to (1) receive the first-phase amplifier output signal and a first-phase reference signal during the first phase to generate a first-phase comparison result, wherein the first-phase comparison result depends on the at least one operating parameter, and (2) receive the second-phase amplifier output signal and a second-phase reference signal during the second phase to generate a second-phase comparison result, wherein the second-phase comparison result depends on the at least one operating parameter; and
means for combining the first-phase and second-phase comparison results to generate a final result such that dependence of the final result on the at least one amplifier operating parameter is negated or reduced.

12. Circuitry comprising:
an amplifier having at least one operating parameter and adapted to (1) receive a first-phase input voltage during a first phase to generate a first-phase amplifier output signal and (2) receive a second-phase input voltage during a second phase to generate a second-phase amplifier output signal;

a comparator adapted to (1) receive the first-phase amplifier output signal and a first-phase reference signal to generate a first-phase comparison result, wherein the first-phase comparison result depends on the at least one operating parameter and (2) receive the second-phase amplifier output signal and a second-phase reference signal to generate a second-phase comparison result, wherein the second-phase comparison result depends on the at least one operating parameter; and a control module adapted to combine the first-phase and second-phase comparison results to generate a final result such that dependence of the final result on the at least one amplifier operating parameter is negated or reduced.

13. The invention of claim 12, wherein:

the amplifier is a first operational transconductance amplifier (OTA) having an offset voltage and a finite output impedance as its at least one operating parameter;

during the first phase:
 a first-phase first-OTA input voltage is applied to the first OTA to generate a first-phase first-OTA output signal;
 a first-phase reference-OTA input voltage is applied to a reference OTA to generate a first-phase reference-OTA output signal;
 the first-phase first-OTA output signal and the first-phase reference-OTA output signal are combined and applied to a first input of the comparator; and
 the first-phase reference signal is applied to a second input of the comparator; and during the second phase:
 a second-phase first-OTA input voltage is applied to the first OTA to generate a second-phase first-OTA output signal;
 a second-phase reference-OTA input voltage is applied to the reference OTA to generate a second-phase reference-OTA output signal;
 the second-phase first-OTA output signal and the second-phase reference-OTA output signal are combined and applied to the first input of the comparator; and
 the second-phase reference signal is applied to the second input of the comparator.

14. The invention of claim 13, wherein:

the first-phase first-OTA input voltage and the first-phase reference-OTA input voltage have substantially identical magnitudes and opposite polarities;

the first-phase first-OTA input voltage and the second-phase first-OTA input voltage have substantially identical magnitudes and opposite polarities;

the first-phase reference-OTA input voltage and the second-phase reference-OTA input voltage have substantially identical magnitudes and opposite polarities;

during the first phase, transconductance of the first OTA is adjusted until an output signal from the comparator indicates that a first-phase balanced condition exists;

during the second phase, the transconductance of the first OTA is adjusted until the output signal from the comparator indicates that a second-phase balanced condition exists; and the first OTA is tuned by setting the transconductance of the first OTA to a value based on the first-phase balanced-condition transconductance of the first OTA and the second-phase balanced-condition transconductance of the OTA.

15. The invention of claim 14, wherein:

the transconductance of the first OTA is adjusted by adjusting a tuning voltage for the first OTA; and the first OTA is tuned by setting the tuning voltage for the first OTA equal to an average of the first-phase balanced-condition tuning voltage for the first OTA and the second-phase balanced-condition tuning voltage for the first OTA.

16. The invention of claim 13, wherein:

the first-phase reference-OTA input voltage and the second-phase reference-OTA input voltage have substantially identical magnitudes and opposite polarities;

during the first phase, the first-phase first-OTA input voltage is adjusted until an output signal from the comparator indicates that a first-phase balanced condition exists;

during the second phase, the second-phase first-OTA input voltage is adjusted until the output signal from the comparator indicates that a second-phase balanced condition exists; and transconductance of the first OTA is determined based on the first-phase balanced-condition first-OTA input voltage and the second-phase balanced-condition first-OTA input voltage.

17. The invention of claim 16, wherein the transconductance $g_{m2}$ of the first OTA is determined according to:

$$g_{m2} = g_{m1} \cdot \left( \frac{2V_1}{V_{DAC}^1 + V_{DAC}^2} \right)$$

wherein:

$g_{m1}$ is transconductance of the reference OTA;

$V_1$ is magnitude of the first-phase reference-OTA input voltage;

$V_{DAC}^1$ is the first-phase balanced-condition first-OTA input voltage; and $V_{DAC}^2$ is the second-phase balanced-condition first-OTA input voltage.

18. The invention of claim 13, wherein:

the second-phase reference-OTA input voltage is substantially twice as large as the first-phase reference-OTA input voltage;

during the first phase, the first-phase first-OTA input voltage is adjusted until an output signal from the comparator indicates that a first-phase balanced condition exists;

during the second phase, the second-phase first-OTA input voltage is adjusted until the output signal from the comparator indicates that a second-phase balanced condition exists; and transconductance of the first OTA is determined based on the first-phase balanced-condition first-OTA input voltage and the second-phase balanced-condition first-OTA input voltage.

19. The invention of claim 18, wherein the transconductance $g_{m2}$ of the first OTA is determined according to:

$$g_{m2} = g_{m1} \cdot \left( \frac{V_1}{V_{DAC}^2 - V_{DAC}^1} \right)$$

wherein:
- $g_{m1}$ is transconductance of the reference OTA;
- $V_1$ is magnitude of the first-phase reference-OTA input voltage;
- $V_{DAC}{}^1$ is the first-phase balanced-condition first-OTA input voltage; and
- $V_{DAC}{}^2$ is the second-phase balanced-condition first-OTA input voltage.

20. The invention of claim 12, wherein:
the amplifier is a variable gain amplifier (VGA) having an offset voltage as its at least one operating parameter;
during the first phase:
   a first-phase VGA input voltage is applied to the VGA to generate a first-phase VGA output signal;
   the first-phase VGA output signal and a first-phase reference signal are applied to the comparator; and
   the gain of the VGA is adjusted until an output signal from the comparator indicates that a first-phase balanced condition exists;
during the second phase:
   a second-phase VGA input voltage is applied to the VGA to generate a second-phase VGA output signal;
   the second-phase VGA output signal and a second-phase reference signal are applied to the comparator; and
   the gain of the VGA is adjusted until the output signal from the comparator indicates that a second-phase balanced condition exists; and
the VGA is tuned by setting the gain of the VGA to a value based on the first-phase balanced-condition gain of the VGA and the second-phase balanced-condition gain of the VGA.

\* \* \* \* \*